United States Patent
Ishikawa et al.

(10) Patent No.: US 8,409,460 B2
(45) Date of Patent: *Apr. 2, 2013

(54) FORMING METHOD OF AMORPHOUS CARBON FILM, AMORPHOUS CARBON FILM, MULTILAYER RESIST FILM, MANUFACTURING METHOD OF SEMICONDUCTOR DEVICE, AND COMPUTER-READABLE STORAGE MEDIUM

(75) Inventors: Hiraku Ishikawa, Miyagi (JP); Tadakazu Murai, Miyagi (JP); Eisuke Morisaki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 650 days.

This patent is subject to a terminal disclaimer.

(21) Appl. No.: 12/528,847

(22) PCT Filed: Feb. 21, 2008

(86) PCT No.: PCT/JP2008/052990
§ 371 (c)(1),
(2), (4) Date: Aug. 27, 2009

(87) PCT Pub. No.: WO2008/105321
PCT Pub. Date: Sep. 4, 2008

(65) Prior Publication Data
US 2010/0105213 A1   Apr. 29, 2010

(30) Foreign Application Priority Data

Feb. 28, 2007   (JP) .................................. 2007-049185

(51) Int. Cl.
*B44C 1/22* (2006.01)
*C23F 1/00* (2006.01)
*C23F 3/00* (2006.01)

(52) U.S. Cl. ............. 216/81; 216/41; 427/460; 427/577
(58) Field of Classification Search ................... 216/81, 216/40, 41; 427/460, 577
See application file for complete search history.

(56) References Cited

U.S. PATENT DOCUMENTS 6,486,082 B1 * 11/2002 Cho et al. ..................... 438/789

FOREIGN PATENT DOCUMENTS

| JP | 61-010241 A | 1/1986 |
| JP | 04-041672 A | 2/1992 |
| JP | 06-267897 A | 9/1994 |
| JP | 2002-012972 A | 1/2002 |
| JP | 2004-266008 A | 9/2004 |

(Continued)

OTHER PUBLICATIONS

International Search Report for PCT/JP2008/052990, dated May 20, 2008.

(Continued)

*Primary Examiner* — Roberts Culbert
(74) *Attorney, Agent, or Firm* — Pearne & Gordon LLP (57) ABSTRACT

An amorphous carbon film forming method is performed by using a parallel plate type plasma CVD apparatus in which an upper electrode and a lower electrode are installed within a processing chamber, and the method includes: disposing a substrate on the lower electrode; supplying carbon monoxide and an inert gas into the processing chamber; decomposing the carbon monoxide by applying a high frequency power to at least the upper electrode and generating plasma; and depositing amorphous carbon on the substrate. It is desirable that the upper electrode is a carbon electrode.

7 Claims, 5 Drawing Sheets

FOREIGN PATENT DOCUMENTS

| | | |
|---|---|---|
| TW | 200535094 A | 11/2005 |
| WO | 2005-074449 A2 | 8/2005 |

OTHER PUBLICATIONS

Chinese office action for 200880006410.X dated Oct. 25, 2010.

Korean Office action for 10-2009-7019776 dated Apr. 19, 2011.
Chinese Office action for 20880006410.X dated Oct. 10, 2011.
Taiwanese Office action for 097106479 dated Aug. 11, 2011.

* cited by examiner

FORMING METHOD OF AMORPHOUS CARBON FILM, AMORPHOUS CARBON FILM, MULTILAYER RESIST FILM, MANUFACTURING METHOD OF SEMICONDUCTOR DEVICE, AND COMPUTER-READABLE STORAGE MEDIUM

TECHNICAL FIELD

The present invention relates to a forming method of an amorphous carbon film applied to a semiconductor device, an amorphous carbon film, a multilayer resist film, a manufacturing method of a semiconductor device and a computer-readable storage medium.

BACKGROUND ART

In a manufacturing process of a semiconductor device, plasma etching has been performed to form a circuit pattern by using a resist patterned by a photolithography technology as a mask. In the 45 nm CD (Critical Dimension) generation, an ArF resist has been used as a mask to keep up with miniaturization, but the ArF resist has a disadvantage of low plasma resistance. As a way to resolve this problem, there has been employed a method called a dry development using a multilayer resist which is formed by stacking a $SiO_2$ film and a plasma-resistant resist underneath the ArF resist. In the generation in which miniaturization has been progressed further than the 45 nm generation, the film thickness of the ArF resist is reduced to 200 nm, so that this thickness serves as a basis of the dry development. That is, a thickness of $SiO_2$ film capable of being plasma-etched by using the resist film of such thickness and a thickness of the lower resist capable of being plasma-etched by using the $SiO_2$ film of such thickness are about 300 nm. However, when the lower resist has that thickness, it is impossible to obtain a sufficient plasma resistance with respect to the film thickness of an etching target, thus resulting in a failure to accomplish an etching with a high precision. For this reason, there has been a demand for a film having a higher etching resistance as an alternative to the lower resist film.

Meanwhile, Patent Document 1 discloses a method of using an amorphous carbon film, which is deposited by CVD (Chemical Vapor Deposition) while using a hydrocarbon gas and an inert gas, as a substitute for the $SiO_2$ film used in the multilayer resist or as an anti-reflection film. An attempt to use the amorphous carbon film for the above-mentioned purpose is considered.

Patent Document 1: Japanese Patent Laid-open Publication No. 2002-12972

DISCLOSURE OF THE INVENTION

Problems to be Solved by the Invention

However, it was proved that the amorphous carbon film formed by the method disclosed in Patent Document 1 does not have a sufficient etching resistance when it is used for the above-mentioned purpose. In this case, it may be considered to improve the etching resistance by setting a temperature for depositing the amorphous carbon to be high (e.g., from 500° C. to 600° C.). However, such a process requiring a high deposition temperature can not be applied to a low-temperature process such as a back-end process performed after the formation of a Cu wiring.

The present invention is conceived in view of the foregoing problems and has an object to provide a forming method of an amorphous carbon film which has a high etching resistance and can be deposited at a low temperature so that it can be applied to a low-temperature process.

Another object of the present invention is to provide an amorphous carbon film having a high etching resistance.

Still another object of the present invention is to provide a multilayer resist film provided with an amorphous carbon film having a high etching resistance.

Still another object of the present invention is to provide a manufacturing method of a semiconductor device including the amorphous carbon film forming method as stated above.

Still another object of the present invention is to provide a computer-readable storage medium storing therein a program for implementing the amorphous carbon film forming method in a deposition apparatus.

Means for Solving the Problems

In order to achieve the above-stated purposes, the present inventors have made a close study repeatedly and thus found that (1) as a content ratio of carbon atom in the amorphous carbon film is high, the etching resistance becomes high, (2) a content ratio of hydrogen atom needs to be decreased in order to increase a content ratio of carbon atom, and (3) an amorphous carbon film having a very low content ratio of hydrogen atom can be formed by using carbon monoxide which does not contain any hydrogen atom in a molecule instead of using a hydrocarbon gas as a gas for supplying carbon in the CVD method, whereby the present invention is derived.

In accordance with a first aspect of the present invention, there is provided an amorphous carbon film forming method including: disposing a substrate in a processing chamber; supplying a processing gas containing a carbon monoxide gas into the processing chamber; and depositing amorphous carbon on the substrate by decomposing the carbon monoxide gas in the processing chamber.

In the first aspect, the carbon monoxide gas may be decomposed by plasma.

In accordance with a second aspect of the present invention, there is provided an amorphous carbon film forming method for forming an amorphous carbon film on a substrate by using a plasma CVD apparatus. The forming method includes: disposing the substrate in a processing chamber; supplying a processing gas containing a carbon monoxide gas into the processing chamber; and depositing amorphous carbon on the substrate by generating plasma and then decomposing the carbon monoxide gas by the plasma.

In the second aspect, it is desirable that an upper electrode and a lower electrode are installed in the processing chamber, in disposing the substrate, the substrate is disposed on the lower electrode, and in depositing the amorphous carbon, a high frequency power is applied to at least the upper electrode. In this case, the upper electrode is desirably made of carbon. Further, it is advantageous that, in depositing the amorphous carbon, a high frequency power for generating plasma is applied to the upper electrode, and a high frequency bias power is applied to the lower electrode. Further, the processing gas may further contain an inert gas, and the inert gas may be a He gas. Further, in depositing the amorphous carbon, a temperature of the substrate is set to be about 350° C. or below, desirably.

In accordance with a third aspect of the present invention, there is provided an amorphous carbon film which is formed on a substrate by CVD using a processing gas containing a carbon monoxide gas.

In the third aspect, the amorphous carbon film may be formed by plasma CVD. Further, a content ratio of hydrogen atom of the amorphous carbon film may be about 20.0 atm % or less, or may be about 18.0 atm % or less.

In accordance with a fourth aspect of the present invention, there is provided a multilayer resist film including: an amorphous carbon film in accordance with the third aspect, formed on an etching target film; a silicon-containing film made of a silicon-containing material, formed on the amorphous carbon film; and a photoresist film formed on the silicon-containing film.

In accordance with a fifth aspect of the present invention, there is provided a semiconductor device manufacturing method including: forming an etching target film on a substrate; forming an amorphous carbon film on the etching target film by the above-described method; forming an etching mask by etching the amorphous carbon film; and forming a predetermined structure by etching the etching target film by using the etching mask.

In accordance with a sixth aspect of the present invention, there is provided a semiconductor device manufacturing method including: forming an etching target film on a substrate; forming an amorphous carbon film on the etching target film by the above-described method; forming a silicon-containing film made of a silicon-containing material on the amorphous carbon film; forming a photoresist film on the silicon-containing film; patterning the photoresist film; pattern-etching the silicon-containing film by using the patterned photoresist film; forming an etching mask by etching the amorphous carbon film by using the pattern-etched silicon-containing film; and etching the etching target film by using the etching mask.

In accordance with a seventh aspect of the present invention, there is provided a computer-readable storage medium storing therein a program, which is operated on a computer, for controlling a deposition apparatus, wherein the program controls the deposition apparatus to perform the method of the first or second aspect on the computer.

Effect of the Invention

In accordance with an embodiment of the present invention, provided is a forming method of an amorphous carbon film which has a high etching resistance and can be formed at a low temperature so that it can be applied to a low-temperature process.

EXPLANATION OF CODES

1: Chamber
2: Susceptor
5: Heater
6: Heater power supply
7: Thermocouple
10: Shower head
14: Gas supply unit
16: High frequency power supply
18: Gas exhaust unit
24: High frequency power supply
30: Process controller
32: Storage unit
100: Deposition apparatus
101: SiC film
102: SiOC film
103: SiC film
104: $SiO_2$ film
105: SiN film
106: Amorphous carbon film
107: $SiO_2$ film
108: BARC
109: ArF resist film
W: Semiconductor wafer

BEST MODE FOR CARRYING OUT THE INVENTION

In accordance with an embodiment of the present invention, since an amorphous carbon film is deposited on a substrate by decomposing a carbon monoxide which does not contain any hydrogen atom, it is possible to form the amorphous carbon film having a low content ratio of hydrogen atom and an excellent etching resistance even at a relatively low temperature.

Further, since the amorphous carbon film can be formed by using an inexpensive carbon monoxide in a conventional plasma processing apparatus without using a special apparatus or an expensive processing gas, it is possible to form the amorphous carbon film having a low content ratio of hydrogen atom and an excellent etching resistance without any increase in manufacturing cost. Furthermore, since the film formation can be performed at a low temperature as stated above, it can be applied to a low-temperature process.

Moreover, when a carbon electrode is used as an upper electrode, oxygen radicals generated by decomposing carbon monoxide are scavenged by carbon of the carbon electrode and thus an amount of the carbon supplied onto the substrate increases. Accordingly, it is possible to heighten a deposition rate of the amorphous carbon film. Further, a content ratio of hydrogen atom in the amorphous carbon film can be further reduced.

Furthermore, an amorphous carbon film in accordance with an embodiment of the present invention has an excellent etching resistance due to a low content ratio of hydrogen atom and a relatively high content ratio of carbon atom. By using the amorphous carbon film in accordance with the embodiment of the present invention as an etching mask, an etching target film is etched, whereby a good etching profile and a high etching selectivity with respect to an underlying layer can be achieved. Particularly, in manufacturing the semiconductor device, if the etching target film is etched by using the amorphous carbon film in accordance with the present invention instead of a lower layer resist of the conventional multilayer resist, a resultant structure can have edges with clear outlines.

Hereinafter, embodiments of the present invention will be explained in detail with reference to the accompanying drawings.

Figure 1:
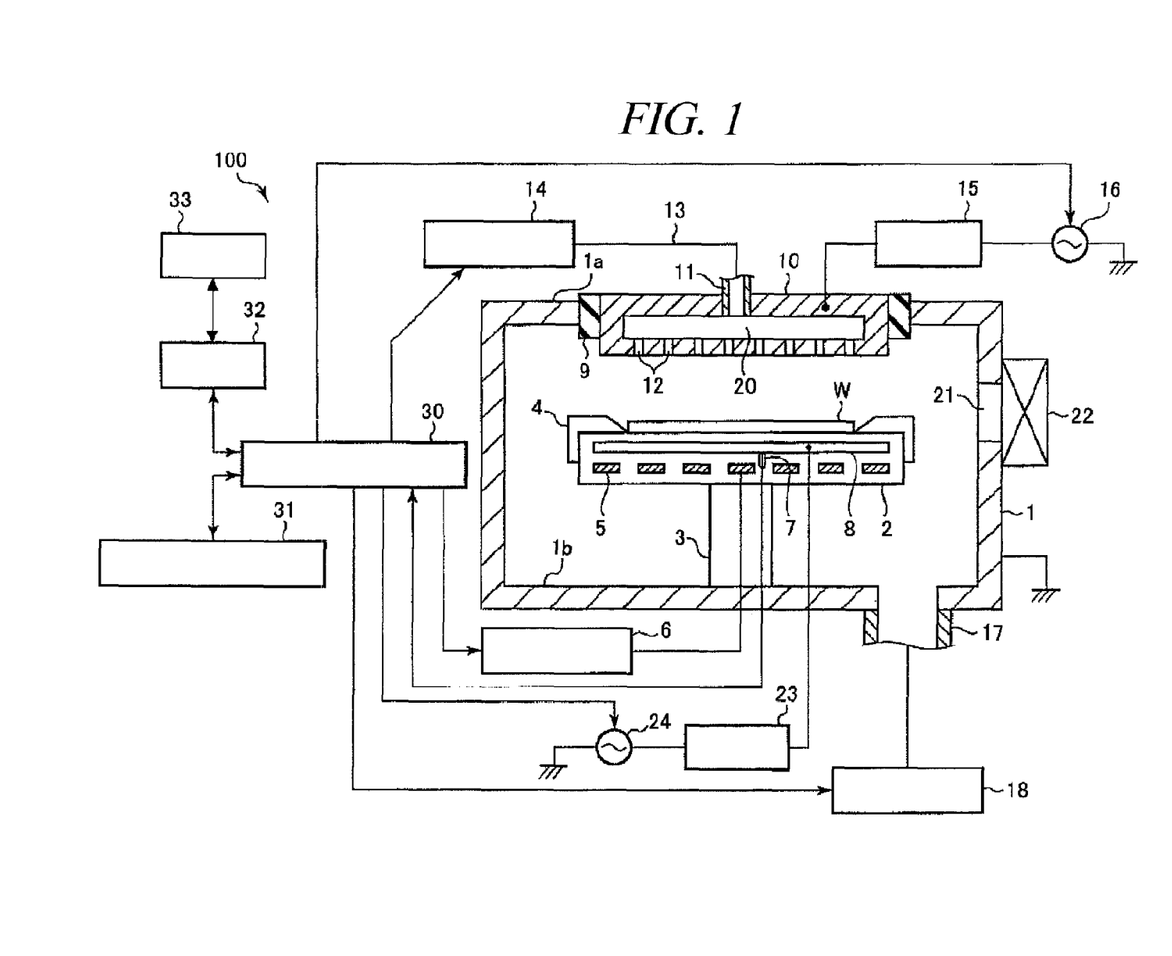
FIG. 1 is a cross-sectional view showing an example of a deposition apparatus suitable for a forming method of an amorphous carbon film in accordance with an embodiment of the present invention.

FIG. 1 illustrates a cross-sectional view of an example of a deposition apparatus (parallel plate type plasma CVD apparatus) which is suitable for performing a forming method of an amorphous carbon film in accordance with an embodiment of the present invention. The deposition apparatus 100 has a substantially cylindrical chamber 1.

A susceptor 2 for horizontally supporting a wafer W, which is a target object to be processed, is installed within the chamber 1. The susceptor 2 is supported by a cylindrical supporting member 3 installed in a central bottom portion within the chamber 1. A guide ring 4 for guiding the wafer W is installed at an outer periphery portion of the susceptor 2. Further, a heater 5 is embedded in the susceptor 2, and if necessary, the heater 5 heats the wafer W up to a specific temperature by a power supplied from a heater power supply 6. A thermocouple 7 is also embedded in the susceptor 2. The output of the heater 5 is controlled based on a detection signal of the thermocouple 7. An electrode 8 (lower electrode) is also buried in the susceptor 2 in the vicinity of the surface thereof. The electrode 8 is connected with a high frequency power supply via a matching unit 23, and if necessary, a high frequency bias power is supplied from the high frequency power supply 24 to the electrode 8. Further, three wafer supporting pins (not shown) for supporting and lifting up and down the wafer W are installed in the susceptor 2 so that they can be protruded from and retracted into the surface of the susceptor 2.

A shower head 10 serving as an upper electrode as well is installed at a ceiling wall 1a of the chamber 1 via an insulating member 9. The shower head 10 is formed in a cylindrical shape and has a gas diffusion space 20 therein. Further, a gas inlet opening 11 for introducing a processing gas is provided in a top surface of the shower head 10, and a plurality of gas injection openings 12 are provided in a bottom surface thereof. The gas inlet opening 11 of the shower head 10 is connected to a gas supply unit 14 for supplying the processing gas containing a carbon monoxide gas for forming an amorphous carbon film through a gas pipe 13.

The shower head 10 is connected to a high frequency power supply 16 via a matching unit 15 so that high frequency power is supplied to the shower head 10 serving as the upper electrode from the high frequency power supply 16. In this way, by supplying the high frequency power from the high frequency power supply unit 16, the processing gas introduced into the chamber 1 through the shower head 10 is excited to generate plasma in the chamber 1.

A gas exhaust pipe 17 is installed at a bottom wall 1b of the chamber 1. The gas exhaust pipe 17 is connected to a gas exhaust unit 18 including a vacuum pump. By operating the gas exhaust unit 18, the inside of the chamber can be depressurized to a specific vacuum level. Installed in a side wall of the chamber 1 are a transfer port 21 through which loading and unloading of the wafer W is performed; and a gate valve 22 for opening and closing the transfer port 21.

Various kinds of components or members of the deposition apparatus 100 such as the heater power supply 6, the gas supply unit 14, the high frequency power supply 16, the high frequency power supply 24, the gas exhaust unit 18 and the like are connected to and controlled by a process controller 30 including a CPU and a peripheral circuit thereof. Further, the process controller 30 is connected to a user interface 31 including a keyboard with which a process manager inputs a command for managing the deposition apparatus 100, a display for displaying an operation of the deposition apparatus 100, and the like. Further, the process controller 30 is connected to a storage unit 32. The storage unit 32 stores therein programs for allowing the process controller 30 to implement various processes in the deposition apparatus 100. The programs include a control program for allowing the process controller 30 to control various processes performed by the deposition apparatus 100 or a program (i.e., recipe) to be used in operating each component of the deposition apparatus 100 according to processing conditions. Furthermore, the programs are stored in a computer-readable storage medium 33 and then downloaded to the storage unit 32. The computer-readable storage medium 33 may be a hard disk (including a portable hard disk) or a semiconductor memory such as a flash memory, or it may be an optical disk such as a CD-ROM or a DVD, a magnetic disk such as a floppy disk, or a USB memory. Moreover, the recipe and the like may be stored in a storage unit 32 from another apparatus such as a server through a line.

Besides, the storage unit 32 can store various recipes from the computer-readable storage medium 33, and a necessary recipe is readout to the process controller 30 from the storage unit 32 in response to an instruction from the user interface 31. The read recipe is executed by the process controller 30, whereby a desired process is performed in the deposition apparatus 100 under control of the process controller 30.

Hereinafter, an embodiment of the amorphous carbon film forming method, which is performed by using the above-described deposition apparatus 100, will be explained.

First, a wafer W is transferred into the chamber 1 and mounted on the susceptor 2. While supplying a plasma generating gas, e.g., an Ar gas, into the chamber 1 from the gas supply unit 14 through the gas pipe 13 and the shower head 10, the inside of the chamber 1 is exhausted by the gas exhaust unit 18 and maintained at a predetermined pressure. Further, the susceptor 2 is heated by the heater 5 if necessary. Furthermore, as the high frequency power is applied to the shower head 10 by the high frequency power supply 16, a high frequency electric field is generated between the shower head 10 and the electrode 8, whereby the processing gas is excited into plasma. At this time, it is desirable to apply the high frequency bias power to the electrode 8 from the high frequency power supply 24.

In this state, a carbon monoxide containing gas such as a carbon monoxide gas with an inert gas are introduced into the chamber 1 from the gas supply unit 14 through the gas pipe 13 and the shower head 10.

In this way, by introducing a processing gas containing the carbon monoxide gas into the chamber 1, the carbon monoxide gas is excited by the plasma in the chamber 1, and the carbon monoxide gas is decomposed (CO→C+O*) above the wafer W, and the generated carbon is deposited to form the amorphous carbon film.

Further, although the amorphous carbon can be deposited by using only the carbon monoxide gas as the processing gas, it is desirable to add the inert gas thereto to generate plasma efficiently and to control a plasma uniformity.

In the technique disclosed in Patent Document 1, the amorphous carbon is deposited by using the hydrocarbon gas and the inert gas serving as a processing gas for forming amorphous carbon. In this case, hydrogen atom originating from the hydrocarbon gas is introduced into the film, so that the amorphous carbon film contains high content ratio (e.g., about 50 atm % or more) of the hydrogen, and thus it has a low etching resistance. In order to solve this problem, it may be considered to improve the etching resistance by raising deposition temperature and reducing the content ratio of the hydrogen atom to a certain extent. However, a deposition process requiring a high deposition temperature can not be applied to a back-end process.

On the contrary, in an embodiment of the present invention, the deposition is performed by a plasma CVD method in which the carbon monoxide that does not contain hydrogen atom in a molecule thereof is introduced into the processing chamber (chamber 1), so that an amorphous carbon film having a low content ratio of hydrogen atom can be obtained even if the amorphous carbon is deposited at a relatively low temperature (e.g., about 200° C. or below), and such a film has an excellent etching resistance.

However, a source gas (processing gas) that does not contain hydrogen atom in a molecule of the source gas may not always be a desirable source gas. For example, in case of using a carbon dioxide gas as a source gas, a concentration of oxygen atom is high, the amorphous carbon may be etched while being deposited. As a result, if the carbon dioxide gas is used as a source material, a deposition rate of the amorphous carbon film becomes very slow, or the amorphous carbon film may not be deposited.

The inert gas to be introduced into the chamber 1 together with the carbon monoxide gas may be a He gas, a Ne gas, an Ar gas or the like. Of these, it is desirable to use the He gas since the amorphous carbon film having a good interfacial morphology can be formed.

It is desirable to set a flow rate ratio of the inert gas with respect to the carbon monoxide introduced into the chamber 1 to be about 0.1 to 10. Further, it is desirable to set a total flow rate of the carbon monoxide and the inert gas to be about 50 to 1000 mL/min (sccm). Furthermore, it is desirable to set the internal pressure of the chamber to be about 665 Pa (5 Torr) or below during deposition.

It is desirable to set a wafer temperature (deposition temperature) during the deposition of the amorphous carbon film to be about 350° C. or below; and, more desirably, about 300° C. or below; and, still more desirably, about 150 to 250° C. At such temperature, application to a back-end process after formation of a Cu wiring is possible. It is possible to form, even at such a relatively low temperature, an amorphous carbon film having a high etching resistance which is required for a lowermost layer of a multilayer resist.

The frequency and the power of the high frequency power applied to the shower head 10 can be properly set according to a required degree of reactivity. By applying the high frequency power in this way, the high-frequency electric field is generated within the chamber 1, so that the processing gas can be excited into plasma, and the formation of the amorphous carbon film can be implemented by plasma CVD. Since the gas excited into plasma has a high reactivity, it is possible to lower the deposition temperature. Further, in the present embodiment, capacitively coupled plasma using the high frequency power is used, but in other embodiments, it may be possible to use inductively coupled plasma or microwave-based plasma generated by introducing a microwave into the chamber 1 through a waveguide and an antenna.

By applying the high frequency power to the shower head 10 from the high frequency power supply 16 and also by applying the high frequency bias power to the electrode 8 from the high frequency power supply 24, the introduction of the hydrogen atom into the film during deposition is suppressed, so that the content ratio of the hydrogen atom in the resultantly obtained amorphous carbon film can be further reduced. The frequency and the power of the high frequency bias power applied to the electrode 8 can also be properly set.

The amorphous carbon film formed as stated above in accordance with the present embodiment has a low content ratio of the hydrogen atom even though the deposition temperature is relatively low. To be specific, the content ratio of the hydrogen atom can be lowered to about 20.0 atm % or below, and further lowered to about 18.0 atm % or below. Although a content ratio of hydrogen atom in an amorphous carbon film formed by using a hydrocarbon gas as a processing gas is typically about 50.0 atm % or more, the content ratio of the hydrogen atom in the amorphous carbon film in accordance with the present embodiment is significantly lower than about 50.0 atm %, so that it has a significantly higher etching resistance than that of the conventional amorphous carbon film.

The amorphous carbon film in accordance with the present embodiment is suitable for a lowermost layer (mask used for etching a film to be processed) of a multilayer resist. Further, this amorphous carbon film has a light absorption coefficient of about 0.1 to 1.0 with respect to a frequency of about 250 nm or less, so that it can serve as an anti-reflection film as well.

When forming the amorphous carbon film in the present embodiment, it is desirable to use a carbon electrode as an upper electrode (shower head 10). Accordingly, the deposition rate can be increased, so that the amorphous carbon film can be efficiently formed.

Figure 2:
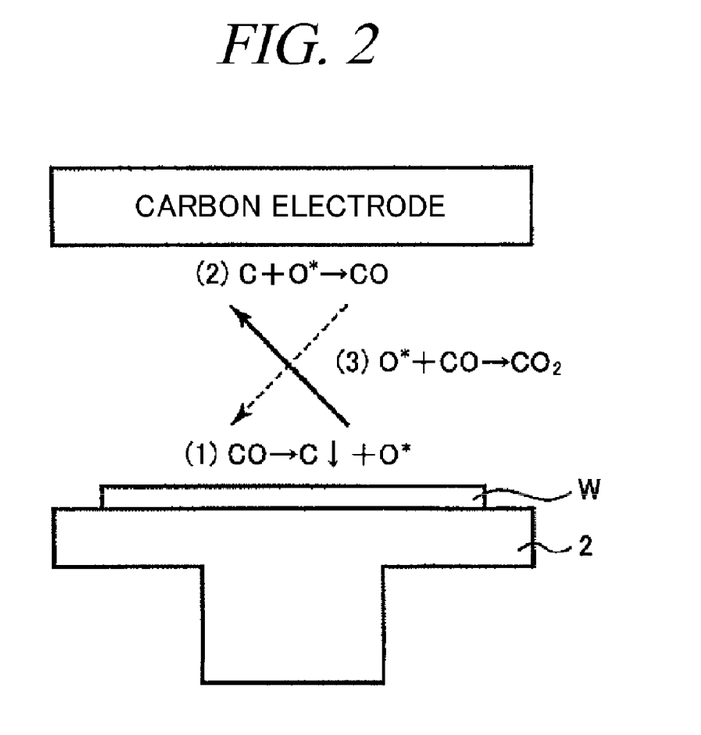
FIG. 2 is a schematic view for explaining a mechanism capable of increasing a deposition rate if a carbon electrode is used as an upper electrode.

The reason for this will be explained hereinafter. If the carbon monoxide gas is decomposed, the oxygen radical (O*) is generated. Since the formed amorphous carbon film can be etched by this oxygen radical, the deposition rate may be decreased. However, by using the carbon electrode as the upper electrode, the deposition rate is not decreased and a high deposition rate can be achieved.

That is, as illustrated in FIG. 2, if the oxygen radical (O*), which is generated when the carbon monoxide is decomposed (CO→C↓+O*) above the wafer W mounted on the susceptor 2, flows in the chamber and reaches the electrode made of carbon, it reacts at a surface thereof with the carbon which is a constituent element of the electrode, thereby generating carbon monoxide (C+O*→CO). This carbon monoxide contributes to the deposition of the amorphous carbon film and also reacts with the oxygen radical to generate carbon dioxide (O*+CO→CO$_2$). The generated carbon dioxide is exhausted from the chamber. (There is a case where the oxygen radical reacts with the carbon monoxide introduced into the chamber to form carbon dioxide.) In this manner, since the oxygen radical, which etches (i.e., suppresses the deposition of) the amorphous carbon film, is scavenged by the carbon electrode, it is supposed that the etching of the amorphous carbon film is suppressed and thus a high deposition rate can be achieved.

Subsequently, there will be explained a manufacturing method of a semiconductor device to which the amorphous carbon film formed as described above is applied.

Figure 3:
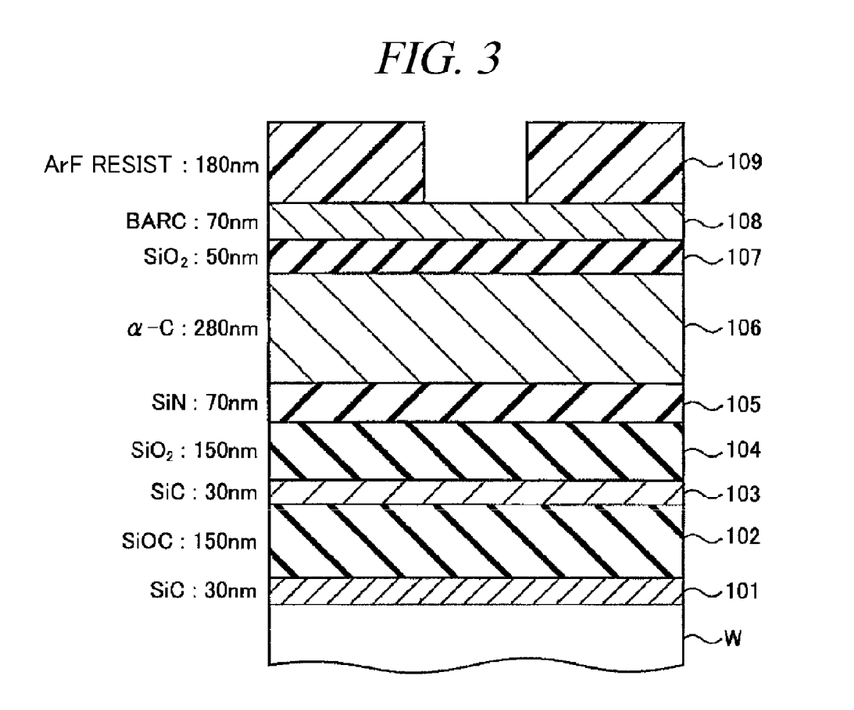
FIG. 3 is a cross-sectional view of a stacked structure for manufacturing a semiconductor device by using an amorphous carbon film obtained by a film forming method of an amorphous carbon film in accordance with an embodiment of the present invention.

As illustrated in FIG. 3, a SiC film 101, a SiOC film (Low-k film) 102, a SiC film 103, a SiO$_2$ film 104 and a SiN film 105 are deposited as films to be etched in that sequence on a semiconductor wafer (Si substrate) W. Thereafter, an amorphous carbon (α-C) film 106, a SiO$_2$ film 107, a BARC (Bottom Anti-Reflection Coating) film 108 and an ArF resist film 109 are formed in that sequence on the SiN film 105 by the above-stated method, and an etching mask is formed by patterning the ArF resist film 109 using photolithography.

Example thicknesses of the ArF resist film 109, the BARC 108, the $SiO_2$ film 107 and the amorphous carbon film 106 are as follows.

Ar resist film 109: 200 nm or less (typically, 180 nm)
BARC 108: 30 to 100 nm (typically, 70 nm)
$SiO_2$ film 107: 10 to 100 nm (typically, 50 nm)
Amorphous carbon film 106: 100 to 800 nm (typically, 280 nm)

Further, example film thicknesses of the films to be etched are as follows.

SiC film 101: 30 nm
SiOC film (Low-k film) 102: 150 nm
SiC film 103: 30 nm
$SiO_2$ film 104: 150 nm
SiN film 105: 70 nm Furthermore, instead of the $SiO_2$ film 107, other thin films containing Si such as SiOC, SiON, SiCN and SiCNH may be used.

Figure 4:
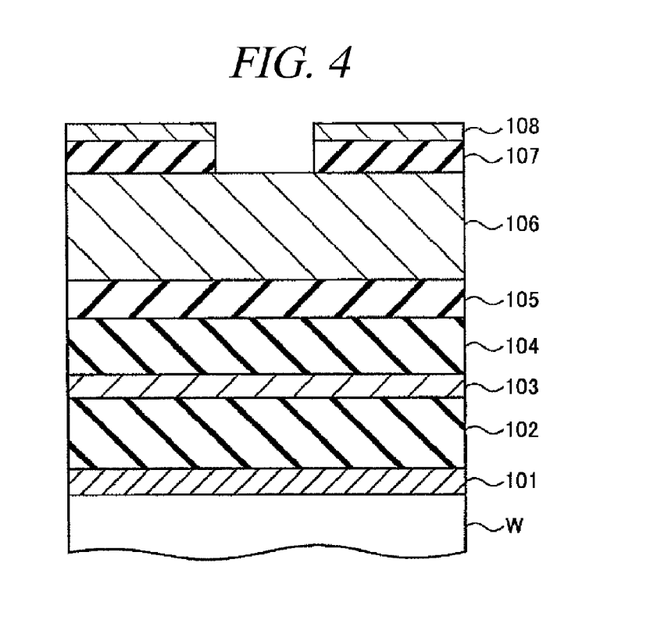
FIG. 4 is a cross-sectional view showing a stacked structure after a $SiO_2$ film underneath a patterned ArF resist is etched by using the patterned ArF resist as a mask.

As illustrated in FIG. 4, the BARC 108 and the $SiO_2$ film 107 are plasma-etched by using the ArF resist film 109 as a mask, and a pattern of the ArF resist film 109 is transcribed onto the $SiO_2$ film 107. Further, in the illustrated example, after the etching, the ArF resist film 109 was removed by the etching because it has a low etching resistance. Moreover, the BARC 108 became thinner by the etching.

Figure 5:
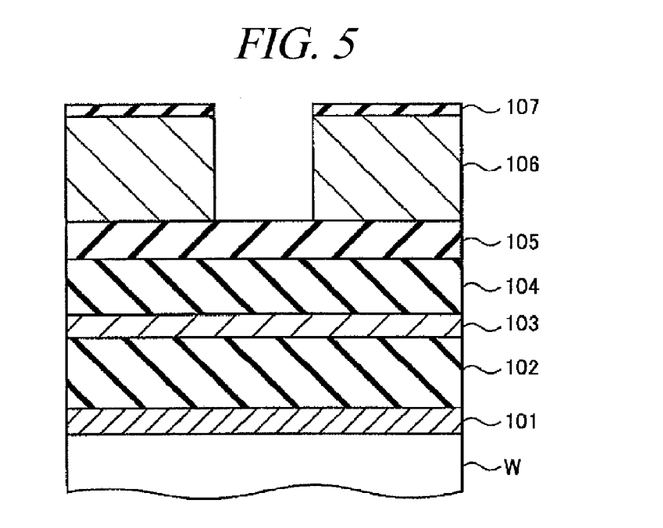
FIG. 5 is a cross-sectional view showing a stacked structure after an amorphous carbon film underneath the etched $SiO_2$ film is etched by using the etched $SiO_2$ film as a mask.

Subsequently, as illustrated in FIG. 5, the amorphous carbon film 106 is etched by using the remaining BARC 108 and $SiO_2$ film 107 as an etching mask. Accordingly, a pattern of the etching mask (substantially the same as the pattern of the ArF resist film 109) is transcribed onto the amorphous carbon film 106. The amorphous carbon film 106 deposited by the above-described method has a high etching resistance, so that it is etched to have edges with clear outlines. In other words, the pattern of the etching mask (pattern of the ArF resist film 109) is accurately transcribed. Further, in the illustrated example, the BARC 108 was removed and the $SiO_2$ film 107 became thinner by the etching.

Figure 6:
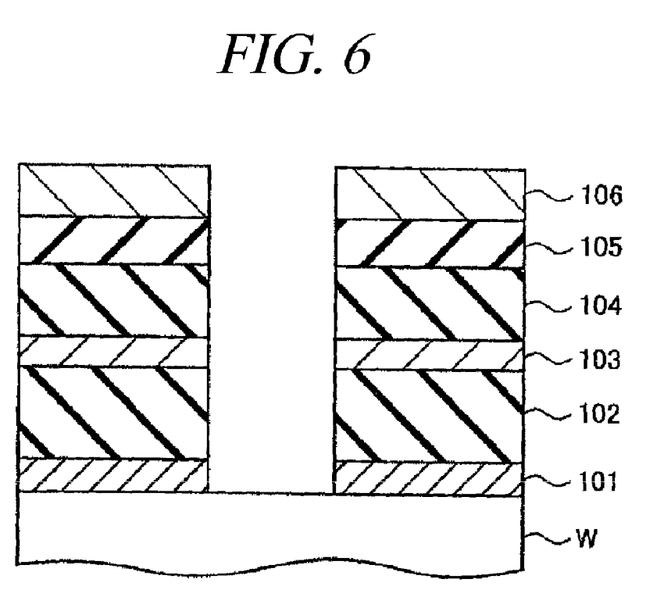
FIG. 6 is a cross-sectional view showing a stacked structure after an underlying etching target film is etched by using the etched amorphous carbon film as a mask.

Thereafter, as illustrated in FIG. 6, by using the amorphous carbon film 106 as an etching mask, the SiN film 105, the $SiO_2$ film 104, the SiC film 103, the SiOC film 102 and the SiC film 101 are etched in sequence by plasma-etching. At this time, the amorphous carbon film 106 deposited by the above-stated method has a high etching resistance, and an etching rate of the amorphous carbon film 106 is sufficiently slower than that of the films 101 to 105. In other words, a high etching selectivity can be achieved in this etching. Therefore, while the films 101 to 105 are etched, the amorphous carbon film 106 remains sufficiently as an etching mask, so that a pattern of the etching mask is accurately transcribed onto the films 101 to 105.

When the etching is completed, the $SiO_2$ film 107 has already been removed and the remaining amorphous carbon film 106 can be removed relatively easily by asking using $H_2$ gas/$N_2$ gas.

Hereinafter, the result confirming the effect of the present invention will be described.

As illustrated in FIG. 1, the wafer W was mounted on the susceptor 2 of the deposition apparatus 100, and while flowing an Ar gas from the gas supply unit 14 through the gas line 13 and the shower head 10 (upper electrode made of silicon), the inside of the chamber 1 was exhausted by the gas exhaust unit 18 and maintained at a depressurized state of 5.3 Pa (40 mTorr). Further, heating of the susceptor 2 by the heater 5 was not performed and a temperature of the wafer W was 20° C. A high frequency power of 27 MHz and 6.5 W/cm$^2$ was applied from the high frequency power supply 16 to the shower head 10, and a high frequency electric field was generated between the shower head 10 and the electrode 8, so that plasma was generated. At this time, a high frequency bias power was not applied from the high frequency power supply 24 to the electrode 8. Then, carbon monoxide and the Ar gas were introduced into the chamber 1 from the gas supply unit 14 through the gas line 13 and the shower head 10. Here, a flow rate of the carbon monoxide was set to be 400 mL/min (sccm) and a flow rate of the Ar gas was set to be 100 mL/min (sccm). Accordingly, the carbon monoxide was decomposed above the wafer W, and the generated carbon was deposited to form an amorphous carbon film thereon. An amount of hydrogen contained in the amorphous carbon film formed in this manner was measured by an ERDA (Elastic Recoil Detection Analysis) method, and a low level result of 17.9 atm % was obtained.

By using a deposition apparatus (A) in which a silicon electrode is installed as an upper electrode (shower head 10) and a deposition apparatus (B) in which a carbon electrode is installed as an upper electrode (shower head 10), amorphous carbon films were formed by a method in accordance with the embodiment of the present invention, and thicknesses of respective amorphous carbon films were measured. Conditions of film formation were as follows.

(Conditions of Film Formation)
Pressure inside the apparatus: 266 Pa (2 Torr)
Temperature of the wafer W: 200° C.
High frequency power applied to the upper electrode: 380 kHz, 3 W/cm$^2$
High frequency bias power applied to the lower electrode: 380 kHz, 2 W/cm$^2$
Flow rate of carbon monoxide: 50 mL/min (sccm)
Flow rate of Ar gas: 13 mL/min (sccm)
Deposition time: 60 seconds As a result, the thickness of the amorphous carbon film obtained by the deposition apparatus (B) having the carbon electrode was about 2 times thicker than that of the amorphous carbon film obtained by the deposition apparatus (A) having the silicon electrode. Accordingly, it was confirmed that a deposition rate can be increased by using the carbon electrode as the upper electrode.

Further, the present invention is not limited to the above-described embodiments, but can be modified in various ways. For example, in the above-described embodiments, though the amorphous carbon film of the present invention is applied to the lower layer of the multilayer resist during the dry development, its application is not limited thereto. For example, the amorphous carbon film can be used as an etching mask having a function of an anti-reflection film by forming it directly under a typical photoresist film, and it can also be used in various other ways.

Furthermore, in the above-described embodiments, though the semiconductor wafer is described as an example of the target substrate, the kind of the target substrate is not limited thereto. For example, the present invention can be applied to a glass plate for use in a flat panel display (FPD) represented by a liquid crystal display (LCD), or the like.

INDUSTRIAL APPLICABILITY

An amorphous carbon film in accordance with the present invention is suitable for an etching mask, which is used in an etching process and requires etching resistance, such as a lower layer of a multilayer resist in a dry development.

The present application includes the subject related to Japanese Patent Application Ser. No. 2007-049185 filed with the Japan Patent Office on Feb. 28, 2007, of which specification, claims and drawings are hereby incorporated by reference in its entirety.

What is claimed is:

1. An amorphous carbon film forming method for forming an amorphous carbon film on a substrate by using a plasma CVD apparatus, the method comprising:
   disposing the substrate in a processing chamber;
   supplying a processing gas containing a carbon monoxide gas into the processing chamber;
   generating plasma in the processing chamber;
   decomposing the carbon monoxide gas by the plasma in the processing chamber; and
   depositing amorphous carbon on the substrate by using carbon decomposed from the carbon monoxide gas,
   wherein an upper electrode and a lower electrode are installed in the processing chamber,
   in disposing the substrate, the substrate is disposed on the lower electrode,
   in depositing the amorphous carbon, a high frequency power is applied to at least the upper electrode, and
   the upper electrode is made of carbon.

2. The amorphous carbon film forming method of claim 1, wherein, in depositing the amorphous carbon, a high frequency power for generating plasma is applied to the upper electrode, and
   a high frequency bias power is applied to the lower electrode.

3. The amorphous carbon film forming method of claim 1, wherein the processing gas further contains an inert gas.

4. The amorphous carbon film forming method of claim 3, wherein the inert gas is a He gas.

5. The amorphous carbon film forming method of claim 1, wherein, in depositing the amorphous carbon, a temperature of the substrate is set to be about 350° C. or below.

6. A semiconductor device manufacturing method comprising:
   forming an etching target film on a substrate;
   forming an amorphous carbon film on the etching target film by a method as claimed in claim 1;
   forming an etching mask by etching the amorphous carbon film; and
   forming a predetermined structure by etching the etching target film by using the etching mask.

7. A semiconductor device manufacturing method comprising:
   forming an etching target film on a substrate;
   forming an amorphous carbon film on the etching target film by a method as claimed in claim 1;
   forming a silicon-containing film made of a silicon-containing material on the amorphous carbon film;
   forming a photoresist film on the silicon-containing film;
   patterning the photoresist film;
   pattern-etching the silicon-containing film by using the patterned photoresist film;
   forming an etching mask by etching the amorphous carbon film by using the pattern-etched silicon-containing film; and
   etching the etching target film by using the etching mask.

* * * * *

UNITED STATES PATENT AND TRADEMARK OFFICE
CERTIFICATE OF CORRECTION

PATENT NO. : 8,409,460 B2  
APPLICATION NO. : 12/528847  
DATED : April 2, 2013  
INVENTOR(S) : Hiraku Ishikawa et al.

Page 1 of 1

It is certified that error appears in the above-identified patent and that said Letters Patent is hereby corrected as shown below:

In the Specification; column 5 line 63, please add -- 1 -- after "chamber".

Signed and Sealed this  
Sixth Day of August, 2013

Teresa Stanek Rea  
*Acting Director of the United States Patent and Trademark Office*